United States Patent [19]

Kraus

[11] 3,876,910

[45] Apr. 8, 1975

[54] START-DELAY OVERLOAD PROTECTION ARRANGEMENT FOR A THYRISTOR SWEEP CIRCUIT

[75] Inventor: Heinz Kraus, Burggrub, Germany

[73] Assignee: Loewe-Opta GmbH, Kronach, Germany

[22] Filed: Feb. 19, 1974

[21] Appl. No.: 443,788

[30] Foreign Application Priority Data

Feb. 21, 1973 Germany ........................ 2308410

[52] U.S. Cl. ................ 317/31; 315/20; 317/33 SC; 317/51

[51] Int. Cl. ........................................ H02h 3/20

[58] Field of Search ...... 315/20, 27 TD, 29; 317/31, 317/33 SC, 51; 328/8; 307/130

[56] References Cited

UNITED STATES PATENTS

| | | | |
|---|---|---|---|
| 3,277,342 | 10/1966 | Ross | 317/51 X |
| 3,449,635 | 6/1969 | Staples | 317/51 X |
| 3,733,519 | 5/1973 | Griffey | 317/31 |

*Primary Examiner*—James D. Trammell

[57] ABSTRACT

An input switching thyristor of a deflection circuit is selectively excited at a sweep rate by a transistorized driver stage. A separate protective thyristor is disposed in a DC power source that supplies operating bias to the driver stage and to the switching thyristor via a supply capacitor. Initially, the supply capacitor is partially charged through a high-ohmic shunt resistor that budges the protective thyristor, whose control electrode is coupled to the output of the switching thyristor. A portion of the resulting voltage across the partially charged supply capacitor is applied via a voltage divider and a Zener diode to the base of a threshold-operated transistor that normally blocks the driver stage. When the supply capacitor has charged to a predetermined minimum value necessary to assume turn-on of the protective thyristor, the threshold-operated transistor is triggered to permit the driver stage to operate the switching thyristor at the sweep rate. The resulting turn-on of the protective thyristor permits the rapid completion of charge of the supply capacitor to its normal operating voltage, and thereafter provides full overload protection for the deflection circuit.

4 Claims, 2 Drawing Figures

START-DELAY OVERLOAD PROTECTION ARRANGEMENT FOR A THYRISTOR SWEEP CIRCUIT

BACKGROUND OF THE INVENTION

One conventional horizontal sweep circuit for a communications receiver has an input switching thyristor which is excitable to trigger the flyback phase at the deflection transformer. For this purpose, the control electrode of the switching thyristor is supplied with pulses at a sweep rate via a transistorized driver stage, whose base is coupled to the output of a horizontal oscillator. A common DC power source coupled to AC mains provides operating bias to the switching thyristor and to the driver stage via an output supply capacitor.

In order to provide overload protection of the deflection circuit it has been proposed to arrange a second protective thyristor in shunt with a high-ohmic bypass resistor in the DC power sound between the main rectifier and the supply capacitor. The voltage at the output of the switching thyristor (determined by the magnitude of the operating bias) is fed back in integrated form to the control electrode of the protective thyristor to maintain the latter in a conductive stage as required. In the presence of an overload in the deflection circuit, the output voltage of the switching thyristor drops to a value insufficient to trigger the protective thyristor on, thereby effecting the removal of operating bias from the deflection circuit.

While this arrangement is generally satisfactory for protection purposes once the deflection circuit is fully operative, its design is such that during start-up of the deflection circuit the driver stage is effectively controlled independently of the DC power source. As a result, start-up of the deflection circuit can occur before the voltage amplitude at the output of the supply capacitor (and thereby at the output of the switching thyristor) has reached a value necessary to assume reliable turnon of the protective thyristor.

SUMMARY OF THE INVENTION

The present invention provides an arrangement for assuring the reliable turn-on of the protective thyristor in the DC source during the start-up of the deflection circuit. In an illustrative embodiment the collector-emitter path of a normally disabled, threshold-operated transistor gate is serially connected with the transistorized driver stage to normally prevent excitation of the latter by the supply capacitor of the DC source. Consequently, the driver stage is initially prevented from starting up the deflection circuit. The base of the threshold transistor is excited by a voltage divider coupled across the supply capacitor.

The rectified current in the DC source initially charges the supply capacitor through the high-ohmic shunt resistor that bridges the normally off protective thyristor. When the voltage across the supply capacitor has reached a predetermined minimum value necessary to assume turn-on of the protective thyristor, the transistor gate is triggered on and the driver stage is excited to supply pulses to the switching thyristor. The rectified current of the power supply can now rapidly complete the charging of the supply capacitor to its full operating voltage through the now-conductive protective thyristor.

BRIEF DESCRIPTION OF THE DRAWING

The invention is further set forth in the following detailed description taken in conjunction with the appended drawing, in which.

DETAILED DESCRIPTION

Figures 1, 2:
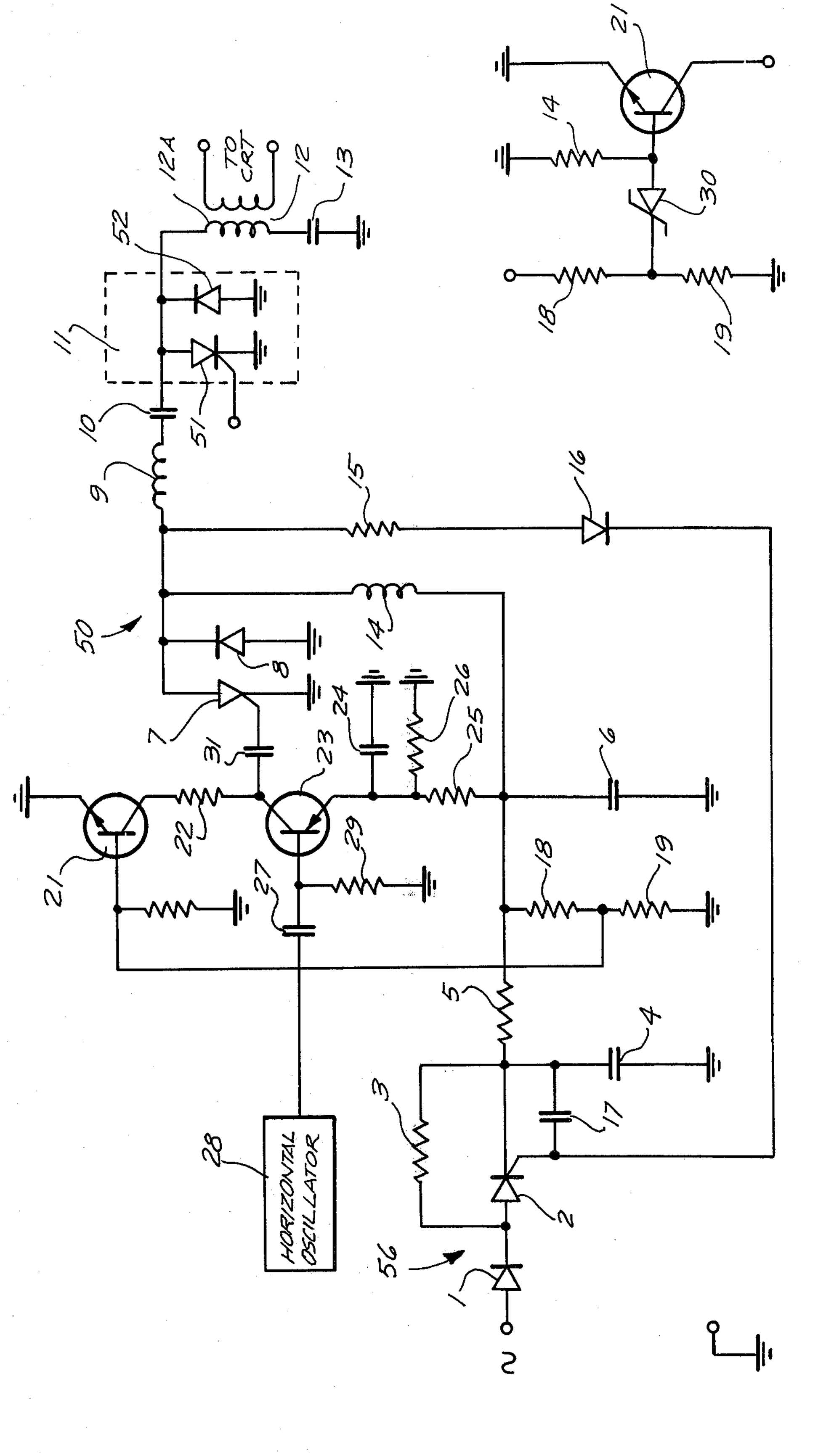
FIG. 1 — is a combined block and schematic diagram of a start-delay deflection circuit protection arrangement in accordance with the invention.
FIG. 2 — is a schematic diagram showing in more detail a threshold circuit useful in the arrangement of FIG. 1.

Referring now to the drawing, FIG. 1 illustrates a position of a communication receiver 49 having a deflection circuit 50, wherein a deflection transformer 12 applies a sweep voltage to the horizontal plates of a cathode ray tube (not shown). The deflection circuit includes an input switching thyristor 7 which may be employed, i.e. to establish the flyback phase of the transformer 12. The transconductive path of the thyristor 7 is shunted by a diode 8 of the opposite polarity. The output of the thyristor 7 is coupled through a series inductor 9 and a storage capacitor 10 to a forward sweep 11, which is schematically shown as having a forward sweep thyristor 51 shunted by an oppositely poled diode 52. The output of the circuit 11 is coupled to a primary winding 12A of the transformer 12, which is returned to ground via a capacitor 13.

In the normal operation of the deflection circuit 50, the control electrode of the switching thyristor 7 is supplied with pulses at the sweep rate from a driver stage 23 embodied by a PNP transistor. The base of the transistor 23 is coupled via an isolating capacitor 27 to the output of a horizontal oscillator 28. The required pulses for exciting the switching thyristor 7 are supplied to its control electrode via the collector of the transistor 23 through capacitor 31. The base of the transistor 23 is returned to ground through a resistor 29.

Operating bias for the transistor 23 and the deflection circuit 50 is supplied from a capacitor 6 disposed at the output of a DC power source 56, whose input terminals coupled to conventional AC mains are shown. In particular, the output of the capacitor 6 is coupled via a voltage divider 25, 26 to the emitter of the driver transistor 23; such emitter is returned to ground via capacitor 24. The output of the capacitor 6 is also coupled through a coil 14 to the deflection circuit 50 for excitation of the transconductive path of the thyristor 7.

The power supply 56 includes a diode 1 whose rectified output is effective to change the capacitor via a resistor 5 and the parallel combination of a normally disabled protective thyristor 2 and a high-impedance shunt resistor 3. In a conventional manner, the control electrode of the thyristor 2 is coupled via resistor 15 and diode 16 to the output of the switching thyristor 7, whose voltage amplitude is determined by the potential on the capacitor 6. Such output voltage is integrated by a capacitor 17 to yield an excitation potential for the thyristor 2 that is greater than its turn-on potential, so that thyristor 2 is ideally rendered conductive during alternate half cycles of the AC means. The capacitor 17 is returned to ground via a capacitor 4.

Theoretically, the protective thyristor 2 is switched to its "on" condition as soon as the driver transistor 23 applies excitation pulses to the control electrode of the transistor 7. In practice, the horizontal oscillator 28 that controls the transistor 23 is independent of the power supply 56, and there is no assurance that the voltage developed across the capacitor 6 and topped off the output of the switching thyristor 7 during turn-on of the deflection circuit will be sufficient to ignite the protective thyristor 2. In accordance with the invention, facilities are provided for preventing turn-on of the deflection circuit 50 until the voltage across the capacitor 6 has reached a predetermined minimum value necessary to assure the turn-on of the protective thyristor 2. In the embodiment shown, such facilities include a normally disabled threshold-operated NPN transistor 21 whose emitter is returned to ground and whose collector is coupled to the collector of the driver transistor 23 through a resistor 22. The base of the transistor 21 is coupled to a center tap 20 of a voltage divider 18, 19 connected in parallel with the supply capacitor 6. The parameters of the voltage divider 18, 19 and the threshold level of the transistor 21 are preferably chosen so that the transistor 21 is triggered on when the voltage at the tap 20 corresponds to the voltage across the capacitor 6 necessary to assume turn-on of the protective thyristor 2.

In operation, when the power supply 56 is first made operative, the rectified current from diode 1 partially charges the capacitor 6 through the high-impedance shunt 3. When the voltage across the capacitor 6 has risen to the point where the potential at the center tap 20 exceeds the threshold voltage of the transistor 21, the latter conducts and permits operating bias from the capacitor 6 to be applied to the driver transistor 23. The latter accordingly conducts to excite the control electrode of the switching thyristor 7 to effect turn-on of the deflection circuit 50.

Under the circumstances just described, the delayed start-up of the deflection circuit 50 is always accompanied by the ignition of the protective thyristor 2. As soon as the latter is made conductive, the rectified current from the diode 1 can rapidly complete the charging of the capacitor 6 to its normal operating voltage. The deflection circuit 50 thereafter operates in its normal, fully protected mode.

In order to increase the stability of the thresold level of the transistor 21, a Zener diode 30 (FIG. 2) may be disposed between the center tap 20 and the base of the transistor 21, as shown. Thus, triggering of the transistor 21 will occur only when the potential at the center tap 20 exceeds the breakdown level of the diode 30.

In the foregoing, the invention has been described in connection with a preferred arrangement thereof. Many variations and modifications will now occur to those skilled in the art. It is accordingly desired that the scope of the appended claims not be limited to the specific disclosure herein contained.

what is claimed is:

1. In a communications receiver wherein (a) a first input switching thyristor of a deflection circuit in the receiver is pulsed at a sweep rate by a driver stage when the latter is excited, (b) a supply capacitor is chargeable through a second protective thyristor by-passed by a high-impedance shunt to provide operating bias to both the driver stage and the switching thyristor, and, (c) the output of the switching thyristor is coupled to the control electrode of the protective thyristor, the improvement which comprises:

normally disabled, threshold-operated gating means connected to the driver stage for preventing the excitation of the driver stage by the supply capacitor while the gating means remains disabled; and means for coupling a selected portion of the voltage across the supply capacitor to the gating means for enabling the gating means when the voltage across the supply capacitor exceeds a predetermined mininmum value.

2. The improvement as defined in claim 1, in which the gating means comprises a first transistor having its collector emitter path connected in series with the driver stage, and in which the coupling means comprises, in combination, a voltage divider having its input terminals connected across the supply capacitor, and means for applying the output of the voltage divider to the base of the first transistor.

3. The improvement as defined in claim 2, in which the applying means comprises a Zener diode.

4. The improvement as defined in claim 2, in which the driver comprises a second transistor, and in which the first and second transistors are of opposite conductivity type.

* * * * *